United States Patent
Fischer et al.

(10) Patent No.: US 6,686,638 B2
(45) Date of Patent: Feb. 3, 2004

(54) MICROMECHANICAL COMPONENT INCLUDING FUNCTION COMPONENTS SUSPENDED MOVABLY ABOVE A SUBSTRATE

(75) Inventors: Frank Fischer, Gomaringen (DE); Lars Metzger, Albstadt (DE)

(73) Assignee: Robert Bosch GmbH, Stuttgart (DE)

( * ) Notice: Subject to any disclaimer, the term of this patent is extended or adjusted under 35 U.S.C. 154(b) by 117 days.

(21) Appl. No.: 10/026,177

(22) Filed: Dec. 20, 2001

(65) Prior Publication Data

US 2002/0096727 A1 Jul. 25, 2002

(30) Foreign Application Priority Data

Dec. 23, 2000 (DE) .......................... 100 65 013

(51) Int. Cl.[7] .......................... H01L 29/82; H01L 29/84
(52) U.S. Cl. .................. 257/415; 257/414; 257/750; 257/756; 257/758; 257/798
(58) Field of Search .................. 257/414–415, 257/750, 756, 758, 798

(56) References Cited

U.S. PATENT DOCUMENTS

| 5,595,940 | A | * | 1/1997 | Trah et al. ................ 438/50 |
| 5,600,190 | A | * | 2/1997 | Zettler .................. 310/40 MM |
| 5,623,164 | A | * | 4/1997 | Auer et al. ................ 257/752 |
| 5,677,560 | A | * | 10/1997 | Zimmer et al. ............ 257/418 |
| 5,918,110 | A | * | 6/1999 | Abraham-Fuchs et al. .... 438/48 |
| 6,063,696 | A | * | 5/2000 | Brenner et al. ............ 438/465 |
| 6,105,427 | A | * | 8/2000 | Stewart et al. ............ 73/514.32 |
| 6,133,059 | A | * | 10/2000 | Werner .................... 438/52 |
| 6,140,689 | A | * | 10/2000 | Scheiter et al. ............ 257/414 |
| 6,218,205 | B1 | * | 4/2001 | Michalicek ................ 438/28 |
| 6,248,609 | B1 | * | 6/2001 | Vigna et al. ................ 438/49 |
| 6,290,858 | B1 | * | 9/2001 | Hirtreiter et al. ............ 216/2 |

FOREIGN PATENT DOCUMENTS

| DE | 42 410 45 | 5/1994 |
| DE | 43 172 74 | 12/1994 |
| DE | 195 37 814 | 4/1997 |
| DE | 197 04 454 | 8/1998 |

* cited by examiner

Primary Examiner—Amir Zarabian
Assistant Examiner—Ida M. Soward
(74) Attorney, Agent, or Firm—Kenyon & Kenyon

(57) ABSTRACT

A micromechanical component and method for its manufacture, in particular an acceleration sensor or a rotational speed sensor, includes: function components suspended movably above a substrate; a first insulation layer provided above the substrate; a first micromechanical function layer including conductor regions provided above the first insulation layer; a second insulation layer provided above the conductor regions and above the first insulation layer; a third insulation layer provided above the second insulation layer; a second micromechanical function layer including first and second trenches provided above the third insulation layer, the second trenches extending to the third insulation layer above the conductor regions and the first trenches extending to a cavity beneath the movably suspended function components in the second micromechanical function layer.

8 Claims, 5 Drawing Sheets

MICROMECHANICAL COMPONENT INCLUDING FUNCTION COMPONENTS SUSPENDED MOVABLY ABOVE A SUBSTRATE

FIELD OF THE INVENTION

The present invention relates to a micromechanical component, in particular an acceleration sensor or a rotational speed sensor including function components suspended movably above a substrate, and a corresponding manufacturing method for the micromechanical component.

BACKGROUND INFORMATION

Although it may be applied to any micromechanical components and structures, in particular to sensors and actuators, the present invention and the underlying problem are elucidated with reference to a micromechanical acceleration sensor that may be manufactured using silicon surface micromachining technology.

Acceleration sensors, in particular micromechanical acceleration sensors manufactured using surface or volume micromachining technology, have an increasing market share in the automotive equipment industry and are increasingly replacing the piezoelectric acceleration sensors customarily used.

Conventional micromechanical acceleration sensors normally operate so that a flexibly mounted seismic mass device, which is deflectable in at least one direction by an external acceleration, on deflection causes a change in the capacitance of a differential capacitor device that is connected to it. This change in capacitance is a measure of the acceleration.

German Published Patent Application No. 195 37 814 describes a method of manufacturing surface micromechanical sensors.

A first insulation layer of a thermal oxide (approximately 2.5 μm thick) is first deposited on a silicon substrate. Then, a thin (approximately 0.5 μm thick) polysilicon layer is deposited on this insulation layer. The polysilicon layer is subsequently doped from the gas phase ($POCl_3$) and structured by a photolithographic process. This conducting polysilicon layer to be buried is thus subdivided into individual regions that are insulated from one another and function as conductors or as surface electrodes arranged vertically.

A second insulation layer is deposited above the layers applied previously. This insulation layer is made up of an oxide generated from the gas phase. In a photolithographic process, the top insulation layer is structured by introducing contact holes into the top insulation layer, through which the underlying polysilicon layer may be contacted.

Then, a thin polysilicon layer, which functions as a seed for subsequent deposition of silicon, is applied. This is followed in another step by deposition, planarization and doping of a thick polycrystalline silicon layer. The deposition occurs in an epitaxial reactor. Then, a structured metal layer is applied to the thick silicon layer.

The thick silicon layer is structured in another photolithographic process, in which a photoresist mask is applied to the top side of the layer to protect the metal layer in the subsequent etching. Then, plasma etching of the thick silicon layer is performed through openings in the photoresist mask according to the method described in German Published Patent Application No. 42 410 45, in which trenches having a high aspect ratio are produced in the thick silicon layer. These trenches extend from the top side of the thick silicon layer to the second insulation layer. The layer is thus subdivided into individual regions that are insulated from one another, unless they are interconnected by the buried conducting layer.

The two sacrificial layers are then removed through the trenches in the area of the freely movable structures of the sensor. The oxide layers are removed by a vapor etching method using media containing hydrofluoric acid according to a method described in German Published Patent Application No. 43 172 74 and German Published Patent Application No. 197 04 454.

However, there are disadvantages with the removal of the sacrificial layer by the hydrofluoric acid vapor etching method. With this etching method, it is very difficult to achieve a defined undercutting, i.e., the oxide is removed not only beneath the functional or freely movable sensor structures, but also above and beneath the buried polysilicon conductors. This requires very wide conductors because the possibility of lateral undercutting must be assumed. Due to the undercutting, no conductors are allowed to pass beneath the functional structure. Another disadvantage is corrosion of the metal layer due to the hydrofluoric acid vapors.

If the water content of the gas phase is too high, there may be sticking problems, i.e., the freely movable sensor elements may adhere to the substrate. Due to the limited oxide thickness (due to the deposition method) of the insulation layers, the distance between the functional structure and the substrate is also limited.

Since the hydrofluoric acid vapor etching method is not compatible with the materials used in CMOS technology, there may not be any integration of the sensor element and the analyzer circuit.

SUMMARY

The micromechanical component according to an example embodiment of the present invention and a corresponding manufacturing method may have the advantage that both the buried conductors and the sacrificial layer beneath the freely movable structures may be made of the same layer. Therefore, fewer layers and photolithographic processes may be needed.

The present invention provides a layer structure and a corresponding method for manufacturing micromechanical components, e.g., acceleration sensors having a lateral sensitivity, sacrificial layer regions being made of the same material, e.g., polysilicon, as the buried conductor regions. A defined etching of the sacrificial polysilicon layer regions is achieved with the method according to the present invention, thus preventing undercutting of the buried conductor regions.

The method according to the present invention allows a simple method of manufacturing a sensor element using only method steps that are conventional in semiconductor technology. In addition, only a few layers and photolithography steps are necessary with the method according to the present invention.

The first micromechanical function layer and the second micromechanical function layer may include polysilicon layers.

According to another example embodiment of the present invention, the first through fourth insulation layers are oxide layers.

In removing the sacrificial layer, if the first micromechanical function layer is made of polysilicon and the insulation layers are oxide layers, then etching media based on fluorine compounds (e.g., $XeF_2$, $ClF_3$, $BrF_3$, etc.) may be used. The etching media have a very high selectivity with respect to silicon dioxide, aluminum and photoresist. Due to this high selectivity, the polysilicon conductor regions that are not to be etched, in contrast with the sacrificial polysilicon layer regions, are sheathed with silicon dioxide. This prevents etching or undercutting of the polysilicon conductor regions.

This also permits a conductor to be guided beneath the freely movable structures. Since the buried polysilicon conductor regions are no longer being undercut, they may be narrower. Reproducible removal of the sacrificial polysilicon layer regions that is well-defined both laterally and vertically is possible with the sacrificial polysilicon layer technology described above. Due to the high selectivity of the etching medium with respect to silicon dioxide, it may be possible to implement a multilayer system of polysilicon conductors and insulation layers, and crossing of lines may also be possible. Large lateral undercutting widths may be feasible in sacrificial layer etching, so that the number of etching holes in the seismic mass may be reduced or omitted entirely. This yields an increase in the seismic mass.

Since the etching process for removing the sacrificial polysilicon layer occurs in the gas phase, no problems may exist with regard to corrosion and sticking. The silicon sacrificial layer technology may be compatible with materials used in CMOS technology, thus permitting integration of the sensor element and analyzer circuit.

It may be possible to structure the insulation layers by dry etching processes through the choice of layer thicknesses and sequence, thus eliminating wet etching processes and yielding improved process tolerances. The distance between the freely movable structure and the silicon substrate layer may be adjustable as needed through the thickness of the polysilicon layer.

According to another example embodiment of the present invention, the conductor regions and the sacrificial layer regions are provided through local implantation and subsequent photolithographic structuring.

According to yet another example embodiment of the present invention, contact holes for connecting the second micromechanical function layer to the conductor regions are provided in the second and third insulation layers.

According to even another example embodiment of the present invention, contact holes for connecting the second micromechanical function layer to the substrate are provided in the first, second and third insulation layers.

DETAILED DESCRIPTION

In the Figures, identical symbols denote identical or functionally equivalent components.

FIGS. 1 to 11 are schematic cross-sectional views illustrating the manufacturing process for an acceleration sensor according to an example embodiment of the present invention.

Figure 1:
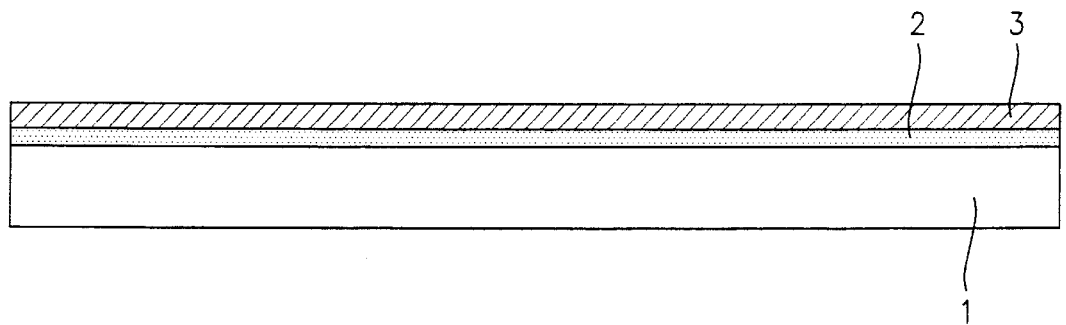
FIGS. 1 to 11 are schematic cross-sectional views illustrating the manufacturing process for an acceleration sensor according to an example embodiment of the present invention.

FIG. 1 illustrates a silicon substrate 1 to which are applied a first insulation layer 2 and then a polysilicon layer 3 on top of the first insulation layer 2. Conventional deposition processes from semiconductor technology for depositing dielectric layers may be used for depositing first insulation layer 2. In addition to silicon dioxide, thus silicon nitride, dielectric layers having a lower dielectric constant than silicon dioxide, various types of glass or other ceramic layers may also be deposited. For the remaining description, it is assumed that first dielectric layer 2 is made of silicon dioxide formed by thermal oxidation of silicon substrate 1 and has a thickness between 10 nm and 2.5 $\mu$m.

Polysilicon layer 3 has a thickness between 0.5 $\mu$m and 5 $\mu$m. After its subsequent structuring, polysilicon layer 3 yields both buried polysilicon conductor regions 4 and sacrificial polysilicon regions 5.

A high conductivity is required for buried polysilicon conductor regions 4, so polysilicon layer 3 is doped from the gas phase ($POCl_3$) over the entire surface area. Any other method of producing a sufficiently highly doped polysilicon layer may also be used. If doping of polysilicon layer 3 is desired only in polysilicon conductor regions 4, the high conductivity in these regions may be produced by local implantation, which requires an additional photolithographic process.

Figure 2:
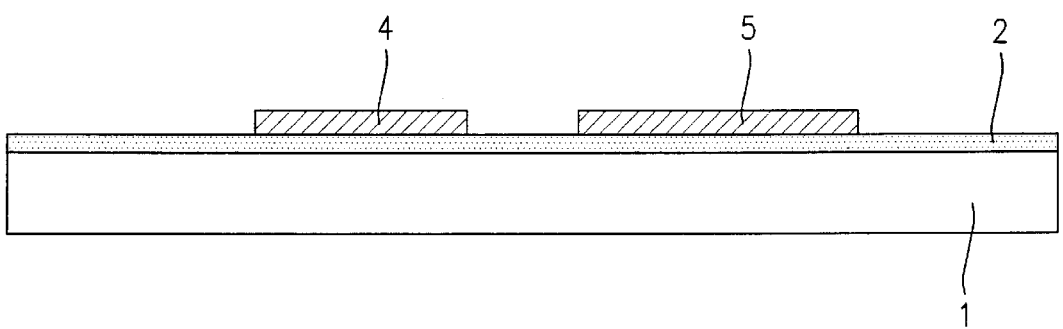

Then, a structuring of doped or partially doped polysilicon layer 3 occurs through a photolithographic process, as illustrated in FIG. 2. This structuring of polysilicon layer 3 occurs by dry etching (plasma etching). Polysilicon layer 3 is thus subdivided into individual, mutually insulated regions 4, 5 that function as buried polysilicon conductor regions 4 and/or as sacrificial polysilicon layer regions 5.

Figure 3:
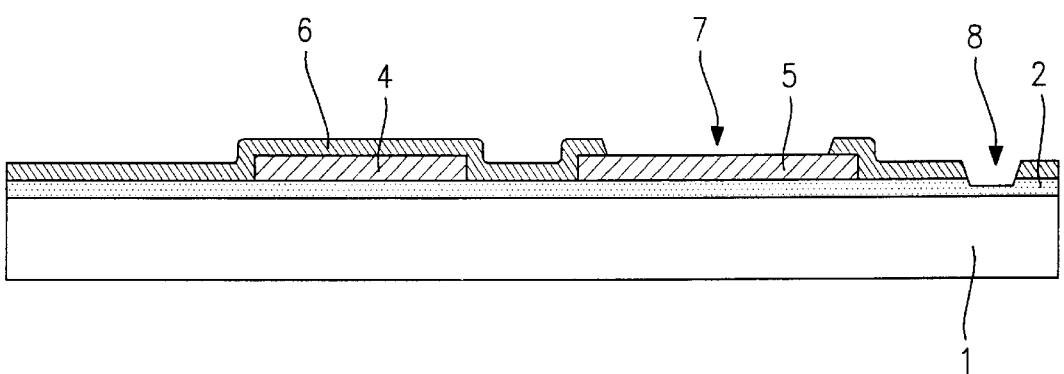

As illustrated in FIG. 3, a second insulation layer 6 is deposited on the structure illustrated in FIG. 2 and structured. The second insulation layer 6 in this example embodiment of the present invention is made of silicon dioxide, which is produced from the gas phase, e.g., by decomposition of silane. The thickness of second insulation layer 6 may be greater than or equal to the thickness of first insulation layer 2.

In another photolithographic process, second insulation layer 6 is structured. The oxide of second insulation layer 6 is removed in region 7 above sacrificial polysilicon layer regions 5 and in region 8 of the substrate contact. Structuring of second insulation layer 6 may also occur by dry etching (plasma etching).

Figure 4:
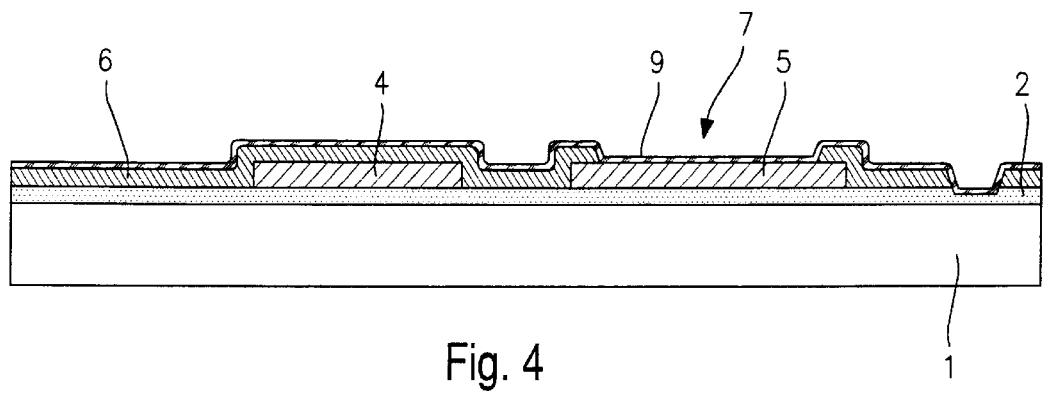

As illustrated in FIG. 4, a third insulation layer 9 is deposited on the structure illustrated in FIG. 3. Insulation layer 9 is configured to protect or passivate structures 25, which are later to be made freely movable (see FIG. 11), on the lower side with respect to the etching medium used in sacrificial layer etching. Third insulation layer 9 may be made of silicon dioxide produced from the gas phase, e.g., by decomposition of silane. Insulation layer 9 is needed only in regions 7 where second insulation layer 6 above sacrificial polysilicon layer regions 5 is removed.

Third insulation layer 9 may also be produced by a local thermal oxidation only in region 7. The layer thickness of third insulation layer 9 may be between 5 nm and 500 nm.

Figure 5:
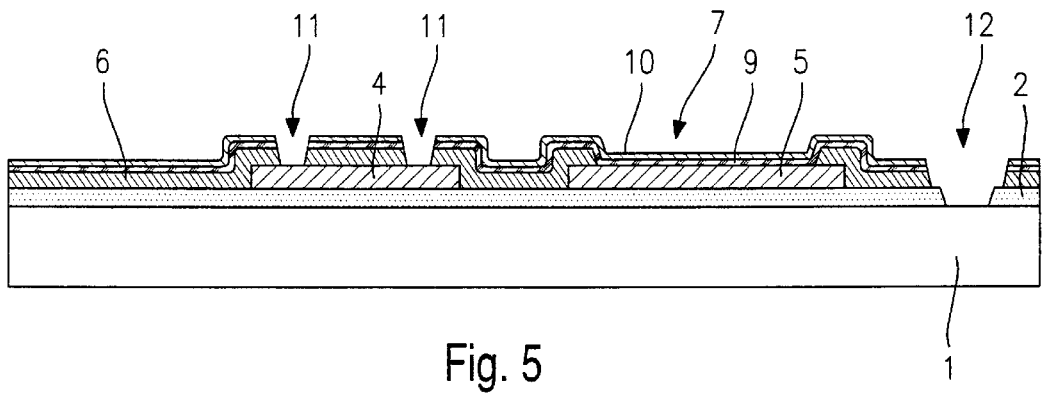

Then, a polysilicon starting layer 10 is deposited on the surface of the structure illustrated in FIG. 4, as illustrated in FIG. 5. Polysilicon starting layer 10 covers the surface of third insulation layer 9 and functions as a seed for the subsequent deposition of polysilicon. To deposit polysilicon starting layer 10, any conventionally used method in semiconductor technology for deposition of thin polysilicon layers on dielectric layers may be suitable.

In a subsequent process step, a photolithographic structuring of polysilicon starting layer 10 and underlying insulation layers 2, 6, 9 or 6, 9 may occur by dry etching (plasma etching).

In the regions above buried polysilicon conductor regions 4, contact holes 11 are introduced into polysilicon starting layer 10 and second and third insulation layers 6, 9, through which underlying polysilicon conductor regions 4 may be contacted.

In the regions where a substrate contact hole 12 is to be produced, polysilicon starting layer 10 and first, second and third insulation layers 2, 6, 9 are structured.

Figure 6:
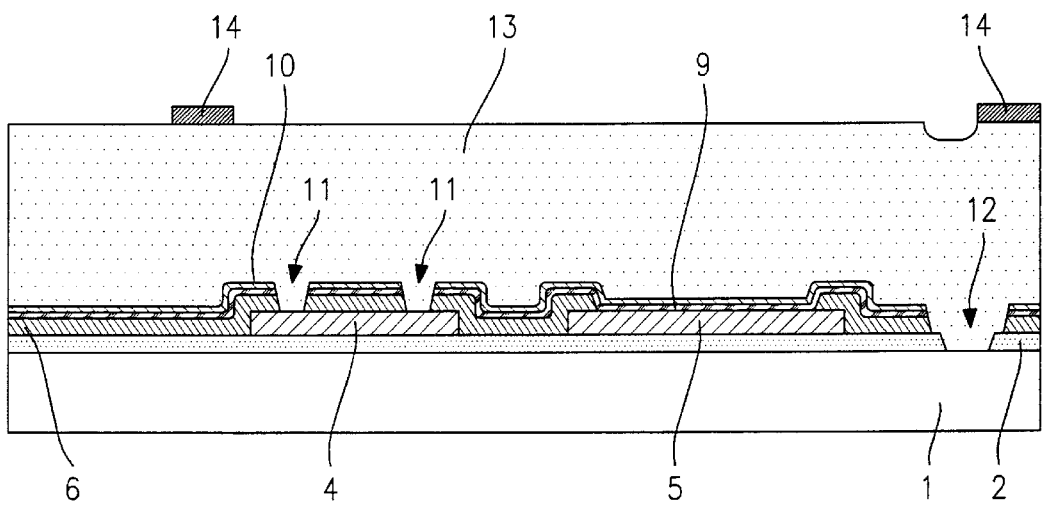

As illustrated in FIG. 6, a thick silicon layer 13 is deposited in another process step. This deposition occurs in a conventional epitaxial reactor. Such an epitaxial reactor is an installation for deposition of silicon layers that is used in semiconductor technology for the production of single-crystal silicon layers on a single-crystal silicon substrate. In the example embodiment according to the present invention, deposition in the epitaxial reactor does not occur on a single-crystal silicon substrate, but instead occurs on polycrystalline silicon starting layer 10, so that no single-crystal silicon layer develops, but instead there is a thick polycrystalline silicon layer 13. Polysilicon starting layer 10 becomes a part of thick polycrystalline silicon layer 13 in this step of the process.

Since polycrystalline silicon layer 13 has a rough surface after this deposition, it is subsequently planarized. An electric connection to buried polysilicon conductor regions 4 is established through thick polycrystalline silicon layer 13 so that thick polycrystalline silicon layer 13 is doped.

Then, a structured metal layer 14 is provided on the top side of thick polycrystalline silicon layer 13. Metal layer 14 may be applied over the entire surface, for example, and then structured.

Figure 7:
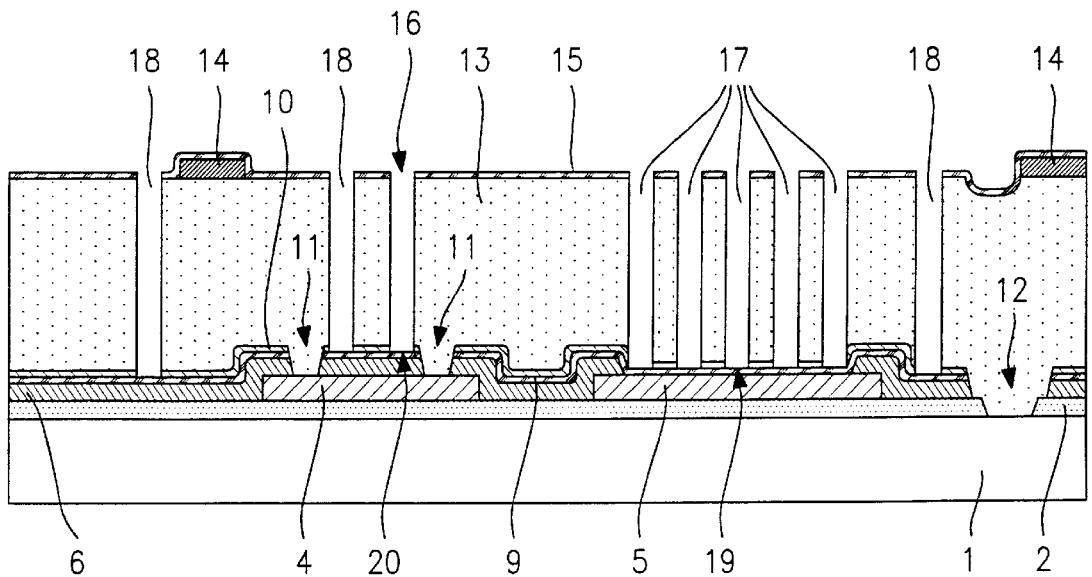

Deposition of a silicon dioxide layer 15 from the gas phase occurs in a subsequent process step, e.g., by decomposition of silane as illustrated in FIG. 7. Silicon dioxide layer 15 may have a thickness between 0.5 µm and 5.0 µm. The layer thickness of silicon dioxide layer 15 may be greater than the layer thickness of insulation layer 9. Silicon dioxide layer 15 is structured by a subsequent photolithographic process. The structuring of silicon dioxide layer 15 may also occur by a dry etching process (plasma etching). Silicon dioxide layer 15 functions as a mask for the subsequent etching process for structuring thick polycrystalline silicon layer 13. It also provides protection for metal layer 14 during subsequent etching. Then, dry etching (plasma etching) of thick polycrystalline silicon layer 13 is performed through openings 16 in silicon dioxide layer 15, which functions as a mask, thus forming trenches 17, 18.

The etching process stops on reaching third insulation layer 9 because it has a very high selectivity of silicon with respect to silicon dioxide. This yields exposed regions 19, 20 at the bottom of trenches 17, 18. Trenches 17, 18 having a high aspect ratio, i.e., a large depth and a low lateral dimension, may be produced by the anisotropic etching process. Trenches 17, 18 extend from the surface of thick polycrystalline silicon layer 13 to third insulation layer 9. Polycrystalline silicon layer 13 is thus subdivided into individual regions that are insulated from one another so that they are not linked together by buried polysilicon conductor regions 4.

The functional structure is produced through trenches 17 which are located above sacrificial polysilicon layer regions 5, or freely movable structures 25 (see FIG. 11) are produced after removal of underlying sacrificial polysilicon layer regions 5. The connecting regions are defined and insulated by trenches 18.

Figure 8:
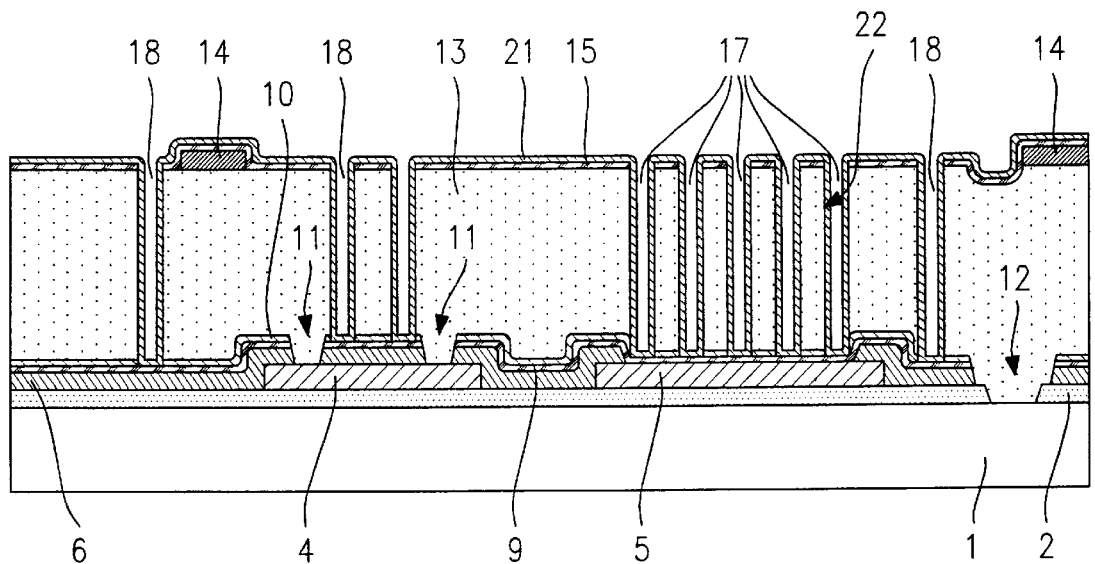

As illustrated in FIG. 8, a fourth insulation layer 21 protecting or passivating the side walls of trenches 22 with respect to the etching medium used in sacrificial layer etching is deposited. This fourth insulation layer 21, which functions as a side wall passivation, may be produced from silicon dioxide deposited from the gas phase, e.g., by decomposition of silane. Since insulation layer 21 is required only on side walls 22 of trenches 17, 18, it may also be produced by local thermal oxidation or by an oxide formed in the oxygen plasma. The layer thickness of insulation layer 21 may be between 5 nm and 500 nm.

To allow the etching medium to be introduced through trenches 17 to sacrificial polysilicon layer 5 to remove sacrificial polysilicon layer regions 5, third and fourth insulation layers 9, 21 are removed at the bottom of trenches 19, 20. This yields trenches 17 having exposed regions 23 of sacrificial polysilicon layer regions 5.

Figure 9:
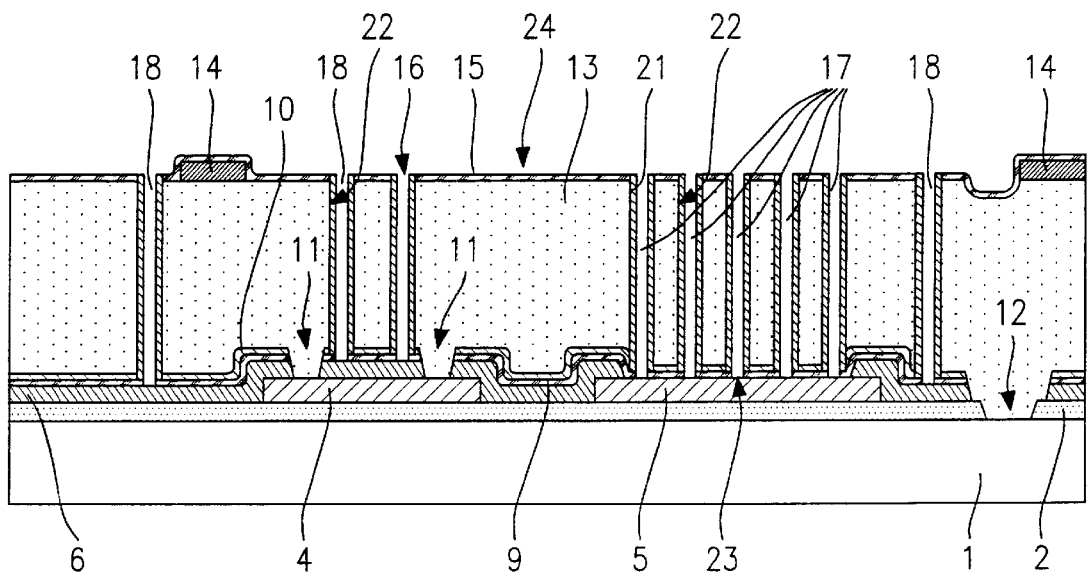

FIG. 9 illustrates the result after removal of third and fourth insulation layers 9, 21 at the bottom of trenches 19, 20. Insulation layers 9, 21 may be removed, for example, by a plasma etching process directed vertically. In this etching step, fourth insulation layer 21 is removed not only at the bottom of trenches 17, 18 but also at surface 24 of the structure illustrated in FIG. 8. Fourth insulation layer 21 thus remains only on side walls 22 of trenches 17, 18.

Silicon dioxide layer 15 is also partially removed in this etching process. Therefore, the silicon dioxide layer 15 may have a greater layer thickness than third insulation layer 9. Since second insulation layer 6 is located between trenches 18 and buried polysilicon conductor regions 4, no exposed regions to the buried polysilicon conductor regions 4 are obtained after removing third and fourth insulation layers 9, 21 at the bottom of trenches 18. Therefore, buried polysilicon conductor regions 4 remain completely enclosed by insulation layer 9.

Figure 10:
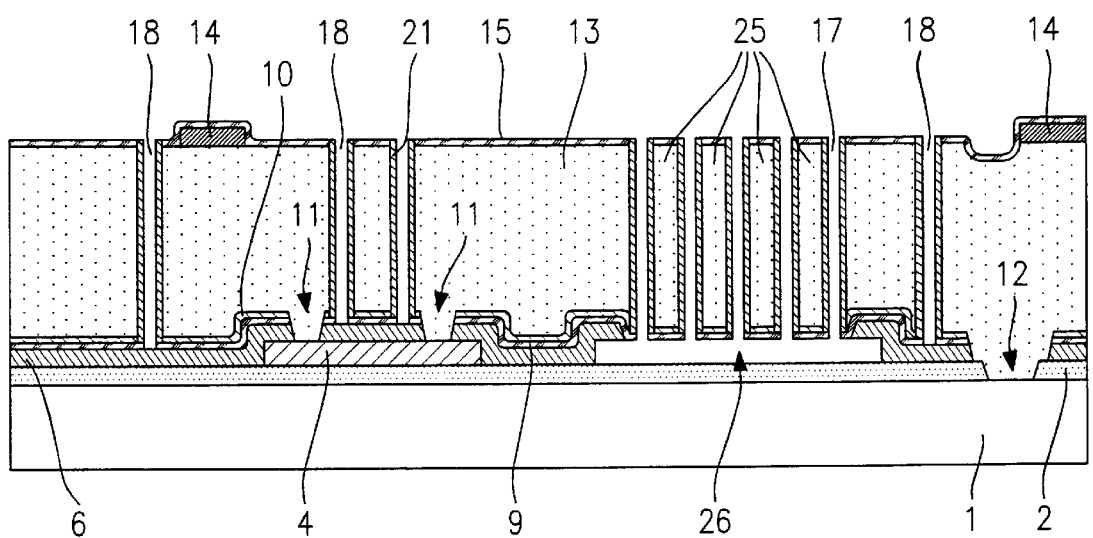

After opening third and fourth insulation layers 9, 21 at the bottom of trenches 17, 18, isotropic etching is performed to remove sacrificial polysilicon layer regions 5 illustrated in FIG. 10. An etching medium such as xenon difluoride, chlorine trifluoride or bromine trifluoride is brought to sacrificial polysilicon layer regions 5 by introducing it through trenches 17. These etching media have a very high selectivity with respect to a non-silicon such as silicon dioxide.

A cavity 26 having predefined lateral and vertical dimensions is produced by removing sacrificial polysilicon layer regions 5, with freely movable structures 25 of the resulting sensor located above this cavity. Freely movable structures 25, buried polysilicon conductor regions 4 and the other regions of thick polysilicon layer 13 are not etched by the etching media because they are protected by the oxide on all sides.

Figure 11:
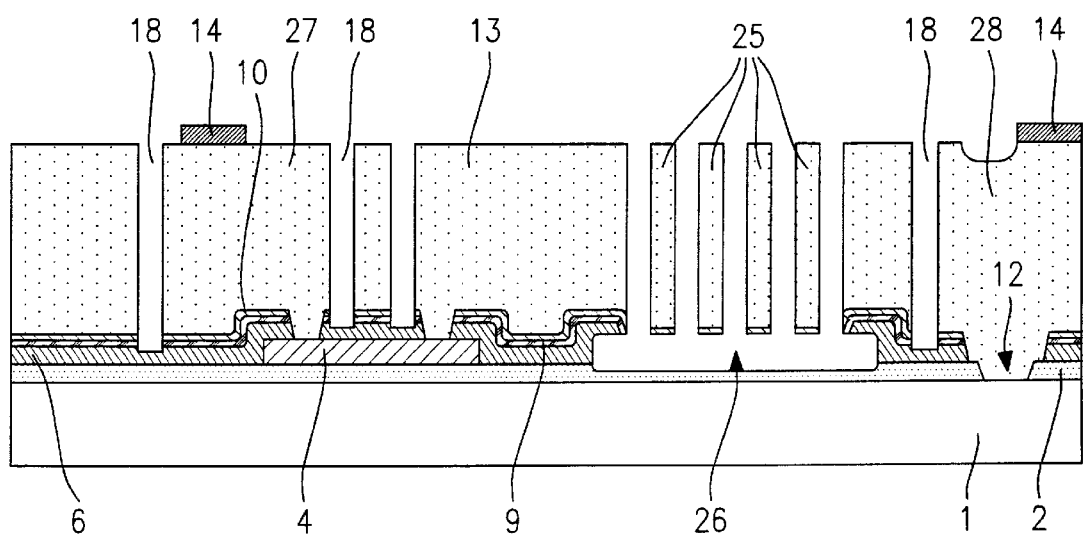

FIG. 11 illustrates the layer structure after removing fourth insulation layer 21 on the side walls of trenches 17, 18, second insulation layer 9 on the lower side of freely movable structures 25 as well as silicon dioxide layer 15 by a vapor etching method using media containing hydrofluoric acid. First insulation layer 2 beneath freely movable structures 25 may also be removed completely if desired.

FIG. 11 thus is a cross-sectional view through an example embodiment of a sensor element. Various function regions have been structured from thick polysilicon layer 13. A terminal region 27, 28, completely surrounded by trenches 18, has been structured out beneath metal layer 14. These terminal regions 27, 28 are thus completely insulated by trenches 18 from the remainder of thick polysilicon layer 13. Terminal region 27 is in direct contact with buried polysilicon conductor region 4, so that contact may be established with the other regions of thick polysilicon layer 13, namely the second neighboring region on the right side. Terminal region 28 is in direct contact with silicon substrate 1, thus implementing a substrate contact. Freely movable structures 25, e.g., parts of interdigital capacitors, are located above cavity 26.

Although the present invention has been described above on the basis of example embodiments, the present invention is not limited to these example embodiments but is, instead, modifiable in a variety of manners.

In particular the choice of layer materials described above is only an example and may be varied as desired. The present invention is also not limited to acceleration sensors and rotational speed sensors.

What is claimed is:

1. A micromechanical component including function components suspended movably above a substrate, comprising:
    a substrate;
    a first insulation layer provided above the substrate;
    a first micromechanical function layer including at least one conductor region and at least one sacrificial layer region provided above the first insulation layer;
    a second insulation layer provided above the conductor region and above the first insulation layer;
    a third insulation layer provided above the second insulation layer;
    a second micromechanical function layer provided above the third insulation layer, the second micromechanical function layer including the suspended function components, at least one first trench and at least one second trench, the first trench extending at least to the third insulation layer and the second trench extending at least to the third insulation layer above the conductor region; and
    a fourth insulation layer arranged above the second micromechanical function layer to one of protect and passivate side walls of the at least one first trench and the at least one second trench.

2. The micromechanical component according to claim 1, wherein the first micromechanical function layer and the second micromechanical function layer include polysilicon layers.

3. The micromechanical component according to claim 1, wherein the first, second, third, and fourth insulation layers include oxide layers.

4. The micromechanical component according to claim 1, wherein the second micromechanical function layer includes nonmovable terminal regions connected electrically to the movably suspended function components.

5. The micromechanical component according to claim 1, wherein the second and third insulation layers include contact holes configured to connect the second micromechanical function layer to the conductor region.

6. The micromechanical component according to claim 1, wherein the first, second and third insulation layers include contact holes configured to connect the second micromechanical function layer to the substrate.

7. The micromechanical component according to claim 1, wherein the micromechanical component includes one of an acceleration sensor and a rotational speed sensor.

8. The micromechanical component according to claim 1, wherein the at least one conductor region and the at least one sacrificial layer region are provided by local implantation and subsequent photolithographic structuring.

* * * * *